US009477161B2

(12) United States Patent
Stowe et al.

(10) Patent No.: US 9,477,161 B2
(45) Date of Patent: Oct. 25, 2016

(54) METHOD AND SYSTEM TO OPERATE ARRAYS OF REFLECTIVE ELEMENTS FOR EXTENDED LIFETIME OPERATION IN USE WITH HIGH INTENSITY POWER LIGHT SOURCES

(71) Applicant: Palo Alto Research Center Incorporated, Palo Alto, CA (US)

(72) Inventors: Timothy D. Stowe, Alameda, CA (US); David K. Biegelsen, Portola Valley, CA (US); Sourobh Raychaudhuri, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 130 days.

(21) Appl. No.: 14/186,562

(22) Filed: Feb. 21, 2014

(65) Prior Publication Data
US 2015/0241798 A1 Aug. 27, 2015

(51) Int. Cl.
*G03F 7/20* (2006.01)

(52) U.S. Cl.
CPC ......... *G03F 7/70891* (2013.01); *G03F 7/7055* (2013.01); *G03F 7/70291* (2013.01); *G03F 7/70425* (2013.01); *G03F 7/70558* (2013.01); *G03F 7/70858* (2013.01); *G03F 7/70875* (2013.01)

(58) Field of Classification Search
CPC ........... G03F 7/70291; G03F 7/70891; G03F 7/70425; G03F 7/7055; G03F 7/70558; G03F 7/70858; G03F 7/70875
See application file for complete search history.

(56) References Cited

U.S. PATENT DOCUMENTS 5,710,619 A * 1/1998 Jain ..................... G03F 7/70241
355/50

(Continued)

OTHER PUBLICATIONS

Katal et al., "Digital Light Processing and its Future Applications", Int'l Journal of Scientific and Research Publications, vol. 3, Issue 4, Apr. 2013, pp. 1-8.

*Primary Examiner* — Michelle M Iacoletti
(74) *Attorney, Agent, or Firm* — Fay Sharpe LLP

(57) ABSTRACT

A method and system is provided to extend operational life of a mirror array of an image generating system, wherein the image generating system further includes a high intensity power light source to cause light to impinge on the mirror array, sufficient to cause deleterious plastic deformation of associated hinges of the mirror array, and an image output generating section configured to receive light from the mirror array. Image date is received by the image generating system image data to control mirrors of the mirror array and to generate an output image. A required level of illumination is provided from the mirror array to the image output generating section over a predetermined time period, in accordance with the received image data. Then during at least a portion of the same predetermined time period of providing the required level of illumination from the mirror array to the image output generating section, de-stress switching operations are performed for selected ones of the mirrors of the mirror array to reduce the plastic deformation of the associated hinges. Next, an output image is generated based on the received image data, wherein the de-stress switching operations occurring during at least a portion of the providing of the desired level of illumination is undetected.

16 Claims, 13 Drawing Sheets

(56) References Cited

U.S. PATENT DOCUMENTS

| | | |
|---|---|---|
| 8,472,104 B2 | 6/2013 | Stowe et al. |
| 8,477,403 B2 | 7/2013 | Stowe et al. |
| 8,502,853 B2 | 8/2013 | Curry et al. |
| 2004/0239901 A1* | 12/2004 | Wasserman ......... G03F 7/70283 355/53 |
| 2007/0070319 A1* | 3/2007 | Nakamura ............ G03F 7/7035 355/55 |

* cited by examiner

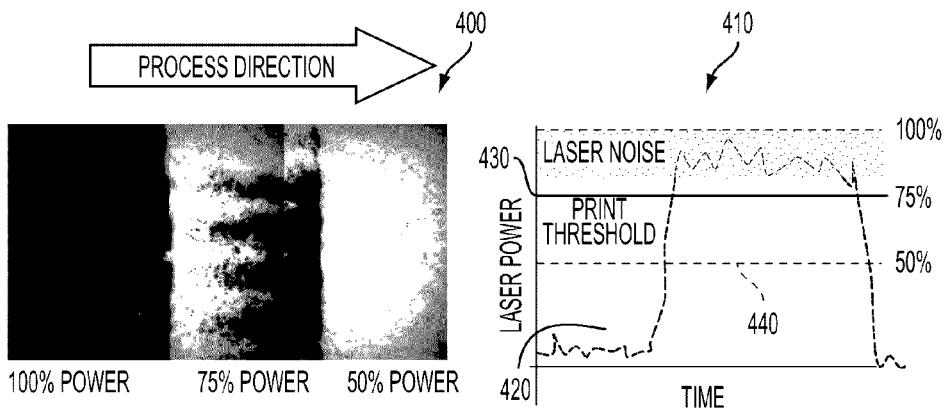
FIG. 4A
FIG. 4B
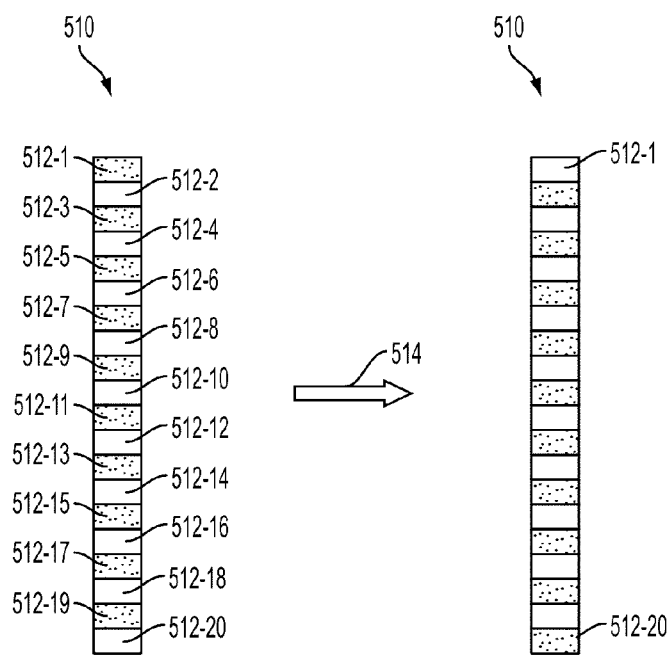
FIG. 5

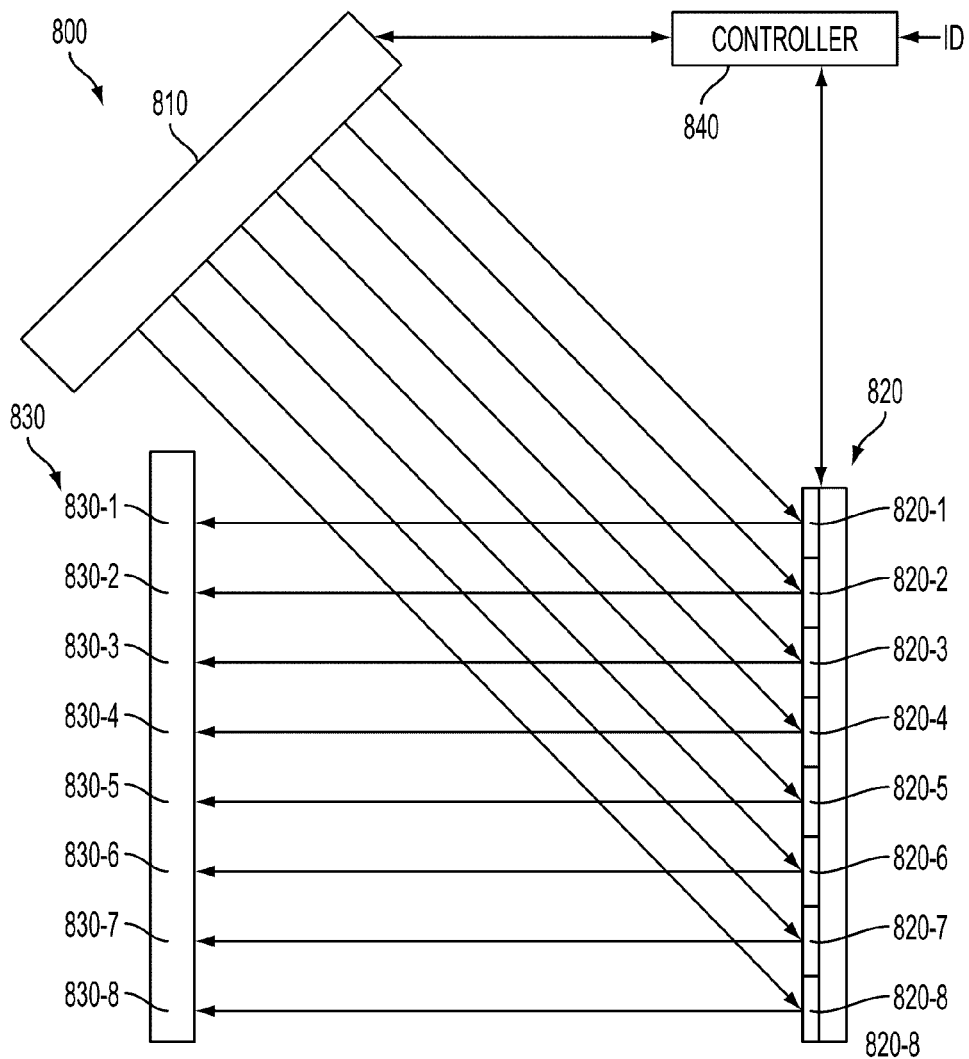
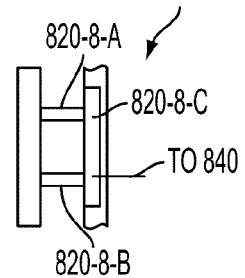
FIG. 8A
FIG. 8B

METHOD AND SYSTEM TO OPERATE ARRAYS OF REFLECTIVE ELEMENTS FOR EXTENDED LIFETIME OPERATION IN USE WITH HIGH INTENSITY POWER LIGHT SOURCES

BACKGROUND

The present application relates to imaging systems, and in particular to imaging systems which utilize arrays of reflective elements, and high intensity power light sources. Each of the reflective elements having two driven states which are electrostatically activated against a flexural restoring force. The array of reflective elements can be implemented in a number of different configurations. Among the possible configurations is an array arrangement that uses hinged mirrors which are titled or rotated by an appropriate force. Another implementation is the use of a suspended reflective film which can be pulled electrostatically towards a transparent ITO electrode on a transparent window, or pulled in the opposite direction towards another electrode. In each case stress would induce an undesirable flexural relaxation in the stressed direction which results in a deleterious effect on the overall array operation.

While the above array implementations have been specifically mentioned, and the following discussion primarily focusses on switching mirror arrays, it is to be understood the present concepts are applicable for any array type configuration where deleterious effects are introduced to the array arrangement due to array switching operations while in an system using a high intensity power light source.

In existing systems mirrors of a switchable mirror array have associated hinge arrangements which allow the individual mirrors to be tilted or rotated in a manner that reflects light incident on the mirror surface. Rotations of the individual mirrors operate in accordance with image data from an electronic controller, which controls operation of the mirror array by applying voltages to one corner (or side) of the mirror or its opposite corner (or side).

When in a mirror OFF state, individual mirrors will reflect the incident light away from a downstream processing section of the imaging system, and when in a mirror ON state, individual mirrors will reflect the incident light to the downstream processing section of the imaging system.

While not limited to, in certain embodiments, the mirror array may be a torsional micro-mirror array configuration, where hinges of the array are composed of amorphous materials including but not limited to aluminum. Further, the high intensity power light source in certain designs is a laser or laser configuration.

It is known that in imaging systems which employ a high intensity power light source, the light energy impinging on the mirror array will cause heating which in turn may result in deleterious plastic deformation of the hinges associated with the individual mirrors of the mirror array. This deformation will often result in hinge creep, which essentially causes individual mirrors of the mirror array to become offset from a pre-determined desired angle. Above a certain level of hinge deformation a mirror may no longer be switchable at the operational switching voltage.

This situation is most commonly found in imaging systems which consist of image patterns having something other than overall 50% mirror ON-times and 50% mirror OFF-times. As more mirrors exhibit the hinge creep effect at higher temperatures, reliability and life expectancy of the entire mirror array is diminished.

However, it is known that by balancing a mirror in opposite stress states, the lifetime of mirror arrangements can be enhanced. For example if a torsional mirror hinge is twisted 50% of the time towards an ON state rotation and 50% of the time towards an OFF state rotation, stress bias is greatly suppressed as creep in one direction reverses creep in the other.

An illustrative example of hinge creep is shown in FIGS. 1A-1C. Particularly, mirror assembly 100 includes a mirror 102, associated hinges 104 and 106, and a controller 108. It is understood the hinges, mirror and controller in these figures are simplified illustrations and commercial versions of these arrangements are more detailed. It is further understood the present discussion is relevant to the mirror arrangements that employ a variety of hinge configurations beyond that shown here. Also, in at least one implementation the switching or rotating is accomplished by electrostatically pulling the mirror in a desired direction.

In FIG. 1A, mirror 102 is shown rotated to a +12° angle when in an ON state, and when mirror 102 is moved to an OFF state it will be at −12°, as shown in FIG. 1B. The rotation of the mirror is accomplished by operation of hinges 104 and 106 under control of controller 108, as is well-known in the art. It is noted that each rotation of the mirror passes through 0°, which is the intended position of the mirror 102 when the mirror array has been powered down.

As shown in FIG. 1C, due to heating caused by a high intensity power light source, deleterious plastic deformation of hinges 104 and 106 has occurred. Particularly, due to the impingement of high intensity light, the whole mirror array structure is heated, allowing the thermally activated processes of dislocation generation and migration to be more probable. Then through dislocation motion in the hinge material (e.g., aluminum) of the mirror array, the hinge stress in the ON or OFF tilt state tends to be relaxed and the hinge takes on a 'set'. The hinge no longer has its original shape, straight for example, but deviates from its original shape (has a curvature in the present example) such that the mirror is tilted towards the stressed state when power is removed. Also, the stress needed to be overcome in switching to the opposite state is now larger. Then, when power to the mirror array is turned off, instead of mirror 102 lying flat at 0°, the lattice of the mirror arrangement has been deformed, and the mirror is not able to return to 0° (i.e., in the example of FIG. 1C only being able to rotate back to a −5° angle), which means when the mirror array is powered back up and attempts are made to switch between the desired +12° (ON) and −12° (OFF), rotation to the +12° (ON) state cannot be achieved. It is to be appreciated that the angles discussed herein are exemplary, and particular imaging systems may have different desired angle positions and flexural configurations. For clarity, it is further explained that the "OFF" state is a distinct concept from power being turned off to the mirrors. When the power supply is off no voltage is applied to either the ON or OFF electrodes, and the mirrors return to their powered down state (e.g., 0° for a well working array, or for the damaged array −5°)

As mentioned above, in imaging systems where operation results in an overall set of image patterns requiring substantially 50% mirror ON times and 50% mirror OFF times, the associated tilt and/or rotation operations act to offset the effects of the heating of the hinges and plastic deformation, and will allow the individual mirrors to be switchable to the expected angles. It is worth mentioning here that for certain array devices, the mirrors are set at the ON and OFF positions by mechanical stops. Other arrays could be more analog in operation, in which case the creep annealing would be even more of an issue. For the ON and OFF type devices, it is only necessary that the mirror be able to be pulled to the state opposite from that of the deformed hinge. For the analog case, the mirror position is more a balance between the electrostatic force and the hinge flexure counter force. In this case the angle of the mirror would also depend on residual deformation of the hinge.

In understanding the above, the existing art has shown that even in systems where image creep is not perfectly balanced during operation, actions can be taken to suppress its effect by exercising the mirrors after all imaging operations have been completed, but prior to turning off (or immediately after turning off) the high intensity power light source (i.e., where exercising of the mirrors includes rapidly switching between ON and OFF states of the individual mirrors). The exercising of the mirrors therefore acts to unwind hinge creep while the imaging system is still in a high temperature state.

The present application provides systems and methods to improve the avoidance and/or reduction of hinge creep in imaging systems which utilize switching mirror array technology and high intensity power light sources.

INCORPORATION BY REFERENCE

U.S. Pat. No. 8,472,104, entitled "Single-Pass Imaging System Using Spatial Light Modulator Anamorphic Projection Optics", issued Jun. 25, 2013, by Stowe et al.; U.S. Pat. No. 8,502,853, entitled "Single-Pass Imaging Method With Image Data Scrolling for Improved Resolution Contrast and Exposure Extent", issued Aug. 6, 2013, by Curry et al.; and U.S. Pat. No. 8,477,403, entitled "Variable Length Imaging Apparatus Using Electronically Registered and Stitched Single-Pass Imaging Systems", issued Jul. 2, 2013, by Stowe et al., are each hereby incorporated by reference as if fully set forth herein.

BRIEF DESCRIPTION

A method and system is provided to extend operational life of a mirror array of an image generating system. The image generating system including a high intensity power light source which causes light to impinge on the mirror array, of sufficient energy to cause deleterious plastic deformation of associated hinges of the mirror array. Also included is an image output generating section configured to receive light from the mirror array. Image data is received by the image generating system, and through the controller is used to control operation of the mirrors of the mirror array and to generate an output image. A required level of illumination is provided from the mirror array to the image output generating section over a predetermined time period, in accordance with the received image data. Then during at least a portion of the same predetermined time period of providing the required level of illumination from the mirror array to the image output generating section, de-stress switching operations are performed for selected ones of the mirrors of the mirror array to reduce the plastic deformation of the associated hinges. Next, an output image is generated based on the received image data, wherein the de-stress switching operations occurring during at least a portion of the providing of the desired level of illumination is undetectable either by a human observer (image projection) or by the process driven by the modulated light at the exit of the image output generating section.

In other embodiments, the present methods and systems also describe an image generating system which (i) maps multiple mirrors to a single output image pixel, and/or (ii) maps a single mirror to a single output image pixel.

In other embodiments, the desired level of illumination is above a (i) predetermined threshold, when the associated pixel is in an ON state, and (ii) below a predetermined threshold, when the associated pixel is in an OFF state.

In other embodiments, the predetermined threshold is one of (i) a fixed threshold value, and (ii) in a range of 5% to 20% from the fixed threshold value.

In other embodiments the present methods and systems perform other de-stress switching operations that occur at a time period between which images are being formed, and/or at a time period following the formation of images and prior to shutdown of the image generating system.

In other embodiments, the present methods and systems use an image generating system that projects a demagnification image, using optical focusing elements.

In other embodiments, the present methods and systems are designed for an image pixel in an OFF state, to have switched ON approximately 30% to 70% of the mirrors associated with the image pixel in the OFF state, and to have the remaining mirrors in an OFF state.

In other embodiments, the present methods and systems are designed where during the de-stress operation selected mirrors of the mirror array are switched out of phase with each other, maintaining an OFF image pixel state, and minimizing hinge memory effects by balancing torsional stresses from hinge creep.

In other embodiments, the present methods and systems are designed where the undetected de-stress switching includes a switching rate of equal to or faster than 30 Hertz.

In other embodiments, the present methods and systems are designed where the high intensity light source generates a light beam having an intensity of 5 W/mm$^2$ to 50 W/mm$^2$.

In other embodiments, the present methods and systems are designed where the mirror array is a micro-mirror array.

In other embodiments, the present methods and systems are designed to enter the mirror array of the image generating system to a power-off state; measure a rest angle of mirrors of the mirror array to obtain residual deformation data of mirrors of the mirror array; provide the residual deformation data to the imaging system; and use the provided residual deformation data in the de-stress switching operations.

In other embodiments, the present methods and systems are designed to provide the de-stress switching operations undetected, which includes at least one of (i) generating a printed output corresponding to the supplied image data that has substantially the same measurable output values a printed output generated using the same supplied image data using the same image generating system without any de-stress switching operations being performed, and (ii) generating a projected output image having substantially the same measurable output values as a projected output image generated using the same supplied image data using the same image generating system without any de-stress switching operations being performed.

In other embodiments, the present methods and systems are designed to include a mirror array including a plurality of mirrors having torsional hinges subject to plastic deformation at high temperatures; a high intensity power light source which is configured to cause light to impinge onto the mirror array; and an electronic controller which includes a memory section configured to operate software to control operation of the high intensity power light source and the mirror array, including being configured to: receive image data to generate an output image; provide a level of illumination from the mirror array to the image processing section over a predetermined time period, in accordance with the received image data; during at least a portion of the same predetermined time period of providing the required level of illumination from the mirror array to the image processing section, perform de-stress switching operations of selected ones of the mirrors of the mirror array to counter plastic deformation of the associated hinges, and generate an image based on the received image data, wherein the de-stress switching operations occurring during at least a portion of the providing of the desired level of illumination is undetected or unimportant to the process being activated.

An example of the above is laser sintering where, within a dwell time, it is only the total energy deposited that matters. Modulation of the light at times much shorter than the thermal time constant will not affect the process.

In other embodiments, the present methods and systems are designed to extend operational life of a mirror array of an image generating system, wherein the image generating system further includes a high intensity power light source to selectively cause light to impinge on the mirror array, resulting in some level of deleterious plastic deformation of associated hinges of the mirror array, and an image processing section configured to receive light from the mirror array. The method and system includes receiving, by the image generating system, image data to generate in output image; during operation of the image generating system to generate the output image, determining a state of the plurality of mirrors of the mirror array; and during operation of the image generating system, selecting a subset of the plurality of mirrors which correspond to a single image pixel, and positioning at least some of the mirrors of the subset to an OFF state and at least another ones of the mirrors of the sub-set to an ON state such that light reflected from the ON subset of the mirrors towards the image processing section of the image generating system provides a desired level of illumination of the corresponding image pixel, and the mirrors of the subset in the OFF state are switched to remove bias stress, wherein the method is performed by use of at least an electronic processor.

BRIEF DESCRIPTION OF THE DRAWINGS

FIGS. 4A and 4B illustrate concepts of a threshold process according to the present application;

FIG. 5 depicts switching of mirrors in an array column in accordance with the concepts of the present application;

FIG. 8A depicts components in an imaging system having a single mirror to single pixel mapping;

FIG. 8B depicts an expanded portion of FIG. 8A

DETAILED DESCRIPTION

The present application provides systems and methods to address the issue of hinge creep in imaging systems that employ mirror arrays (as found for example in spatial light modulators manufactured by various manufacturers such as Digital Light Processor chips of Texas Instruments as well as others), and high intensity power light sources (such as but not limited to various lasers and laser arrangements, such as those that generate light intensity in the range of approximately 5 W/mm$^2$ to 50 W/mm$^2$, or more).

Such imaging systems are applicable to a wide range of uses such as but not limited to, lithographic printing, laser marking, laser sintering, 3D printing, theater projection, wearable imaging technology (such as enhanced eyewear, including but not limited to Google glass type technology), as well as others. Imaging systems such as these are designed to map multiple mirrors from the mirror array to a single pixel and/or from a single mirror to a single pixel.

Multiple Mirrors to Single Pixel Imaging Systems

Many imaging/printing processes, such as those mentioned above, as well as others, operate on a threshold based development curve. This means that if power is below a certain appropriate or critical threshold, such as below 50% of a total output, no noticeable change is activated. Only after the high intensity light power (e.g., laser power) reaches the critical threshold does a change result. It is to be understood that while in this discussion the critical threshold percentage is primarily identified as being 50%, other threshold values may be employed.

For explanation of the present concepts a particular example set forth herein is related to a variable data lithographic printing system as described in connection with FIGS. 2A-2B. It is understood however, this description is not intended to limit the applicability of the present concepts to this particular type of imaging system.

Figure 1A:
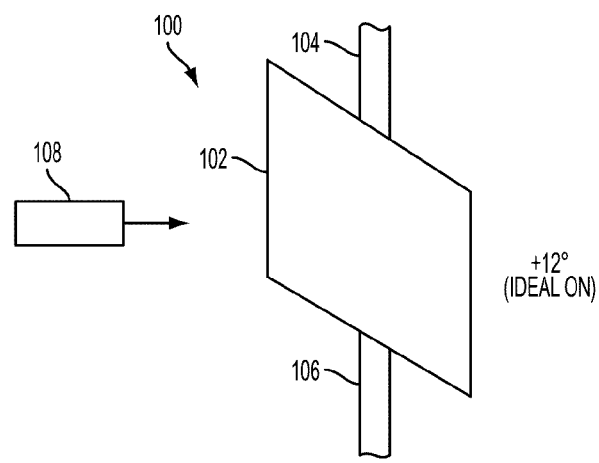
FIGS. 1A-1C provide an illustrated example applicable to the present application.
Figure 1B:
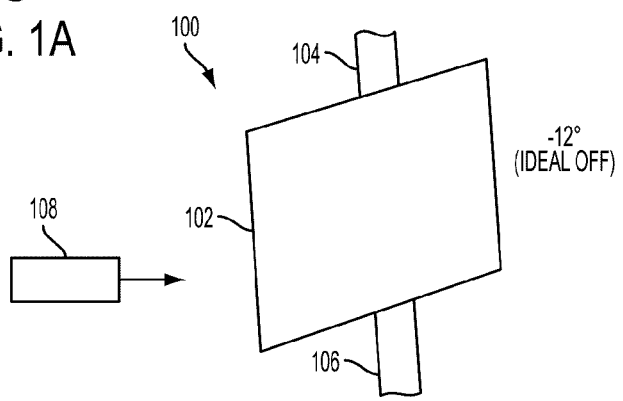
Figure 1C:
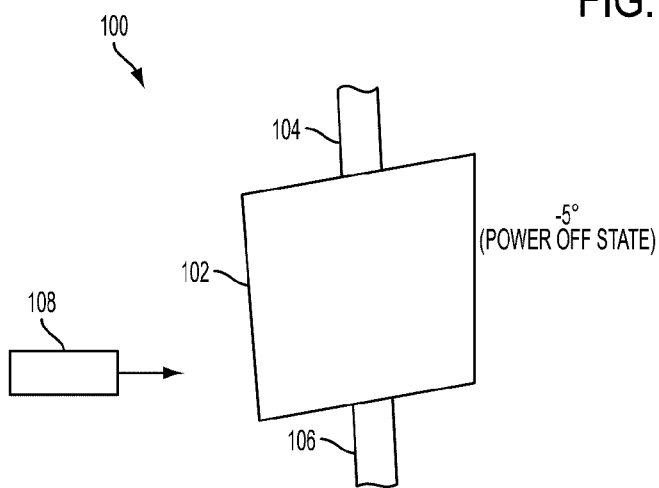
Figures 2A, 2B:
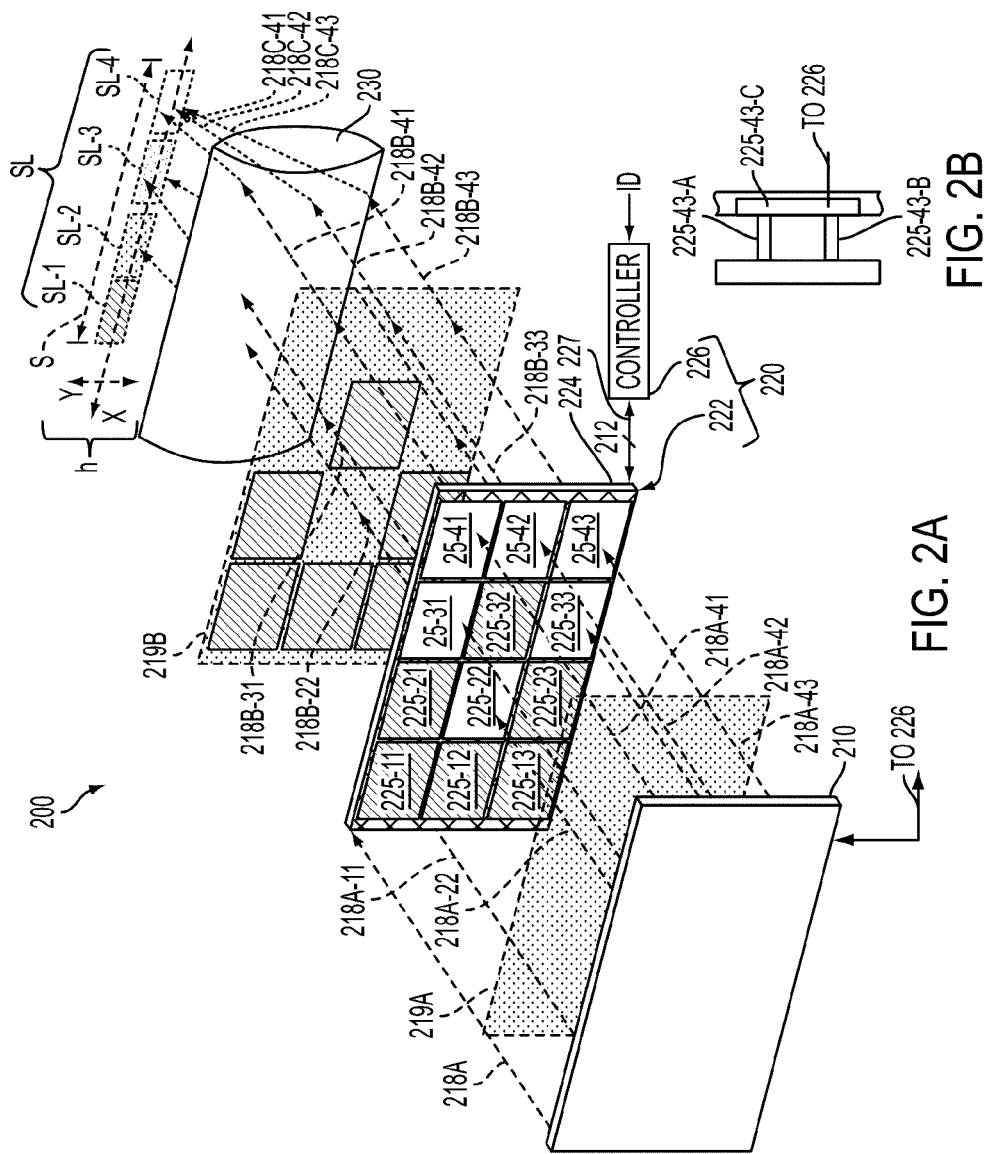
FIG. 2A illustrates a variable data lithographic printing system in which the contents of the present application may be implemented.
FIG. 2B shows an expanded portion of FIG. 2A.

FIG. 2A shows a perspective view of a single-pass data lithographic printing system 200 in which the concepts of the present application may be applied. Imaging system 200 generally includes a homogenous light generator (in one embodiment in the form of a high intensity power light source (such as laser or laser configuration) 210, a spatial light modulator 220 (including a modulating array (e.g., mirror) array 222), and an anamorphic optical system 230 represented for the purposes of simplification by a single generalized anamorphic projection lens. Controller 226 is in operative connection with high intensity power light source 210 and spatial light modulator (including mirror array 222) 220 to send and receive data, as well as being configured to receive external image data (ID).

It is understood that in variable data lithographic printing, the laser power of at least 20 or more mirrors of a mirror array are typically combined into one print pixel under anamorphic-projection architecture. Also, the details of this architecture are more fully described in the following patents: U.S. Pat. Nos. 8,477,403, 8,502,853, 8,472,104, each incorporated herein by reference in their entirety.

Referring now to the lower left portion of FIG. 2A, homogenous light generator 210 serves to generate continuous (i.e., constant/non-modulated) homogenous light 218A that forms a substantially uniform two-dimensional homogenous light field 219A.

Referring to the center left portion of FIG. 2A, spatial light modulator 220 is disposed in homogenous light field 219A, and serves the purpose of modulating portions of homogenous light 218A in accordance with predetermined scan line image data ID, whereby spatial light modulator 220 generates a modulated light field 219B that is projected onto anamorphic optical system 230. For purposes of illustration, only a small subset of light modulation elements is depicted in FIG. 2A. Spatial light modulator 220 includes modulating array (e.g., a mirror array) 222 made up of modulating elements (e.g., mirror or mirror arrangements) 225-11 to 225-43 disposed in a two dimensional array on a support structure 224, and a control circuit (controller) 226 for transmitting control signals 227 to modulating elements 225-11 to 225-43 in response to scan line image data ID. Modulating elements 225-11 to 225-43 are disposed such that a light modulating structure (e.g., an array of reflective elements with two driven states which are electrostatically activated against a flexural restoring force) receives a corresponding portion of homogenous light 218A (e.g., modulating or reflective elements 225-11 and 225-22 respectively receive homogenous light portions 218A-11 and 218A-22), and is positioned to selectively pass or redirect the received corresponding modulated light portion along a predetermined direction toward anamorphic optical system 230 (e.g., modulating element 225-22 passes modulated light portion 218B-22 to anamorphic optical system 230, but 225-11 deflects light from reaching anamorphic optical system 230). In particular, each light modulating element 225-11 to 225-43 is individually controllable to switch between an "ON" (first) modulated state and an "OFF" (second) modulated state in response to associated portions of scan line image data ID. When a given modulating element (e.g., modulating element 225-43) is in the "ON" modulated state, the modulating element is actuated to direct the given modulating element's associated received light portion toward anamorphic optic 230. For example, in the simplified example, modulating element 225-43 is rendered transparent or otherwise controlled in response to the associated control signal such that modulated light portion 218B-43, which is either passed, reflected or otherwise produced from corresponding homogenous light portion 218A-43, is directed toward anamorphic optic 230. Similarly, modulating elements 225-41 and 225-42 are rendered transparent or otherwise controlled to produce modulated light portions 218B-41 and 218B-42 from corresponding homogenous light portions 218A-41 and 218A-42. Conversely, when a given modulating element (e.g., modulating element 225-11) is in the "OFF" modulated state, the modulating element is actuated to prevent (e.g., block or redirect) the given modulating element's associated received light portion (e.g., light portion 218A-11) from reaching anamorphic optic 230. By selectively turning "ON" or "OFF" modulating elements 225-11 to 225-43 in accordance with image data supplied to controller 226 from an external source (not shown), spatial light modulator 220 serves to modulate (i.e., pass or not pass) portions of continuous homogenous light 118A such that a two-dimensional modulated light field 219B is generated that is passed to anamorphic optical system 230.

Referring to the center right portion of FIG. 2A, anamorphic optical system 230 serves to anamorphically concentrate (focus) the modulated light portions, which are received from spatial light modulator 220 by way of two-dimensional light field 219B, onto an elongated scan line SL having a width S (i.e., measured in the X-axis direction indicated in FIG. 2A) and a height h (i.e., measured in the Y-axis direction indicated in FIG. 2A). In particular, anamorphic optical system 230 includes one or more optical elements (e.g., lenses or mirrors) that are positioned to receive the two-dimensional pattern of light field 219B that are directed to anamorphic optical system 230 from spatial light modulator 220 (e.g., modulated light portion 218B-43 that is passed from modulating element 225-43), where the one or more optical elements (e.g., lenses or mirrors) are arranged to concentrate the received light portions to a greater degree along the non-scan (e.g., Y-axis) direction than along the scan (X-axis) direction (e.g., commonly the line width is expanded along the X-axis), whereby the received light portions are anamorphically focused to form an elongated scan line image SL that extends parallel to the scan (X-axis) direction. For example, light portions 218B-41, 218B-42 and 218B-43 are concentrated by anamorphic optical system 230 to form concentrated light portions 218C-41, 218C-42 and 218C-43 that anamorphically focused as elongated scan line image portion SL-4.

Light modulating elements 225-11 to 225-43 of spatial light modulator 220 are disposed in a two-dimensional array 222 of rows and columns, and anamorphic optical system 230 is arranged to concentrate light portions passed through each column of modulating elements on to each imaging region SL-1 to SL-4 of scan line image SL. As used herein, each "column" includes light modulating elements arranged in a direction that is substantially perpendicular to scan line image SL (e.g., light modulating elements 225-11, 225-12 and 225-13 are disposed in the leftmost column of array 222), and each "row" includes light modulating elements arranged in a direction substantially parallel to scan line image SL (e.g., light modulating elements 225-11, 225-21, 225-31 and 225-41 are disposed in the uppermost row of array 222). In the simplified arrangement shown in FIG. 2, any light passed through elements 225-11, 225-12 and 225-13 is concentrated by anamorphic optical system 230 onto imaging region SL-1, any light passed through elements 225-21, 225-22 and 225-23 is concentrated onto imaging region SL-2, any light passed through elements 225-31, 225-32 and 225-33 is concentrated onto imaging region SL-3, and any light passed through elements 225-41, 225-42 and 225-43 is concentrated onto imaging region SL-4.

In addition to the above, it is mentioned that one manner of greyscale imaging is achieved in the imaging system of FIG. 2A by controlling the ON/OFF states of selected modulating elements in each column of array 222. That is, the brightness (or darkness) of the "spot" formed on each imaging region SL-1 to SL-4 is controlled by the number of light modulating elements that are turned "ON" in each associated column. Another manner of controlling the greyscale is via time modulation. Within a pixel dwell time any given spot can be turned ON and OFF multiple times. By varying the ratio of ON to ON+OFF times a greylevel can be controlled.

It is also noted that FIG. 2A depicts a simplified view of the imaging system for explanation purposes, and that those skilled in the art will recognize that an operating system of this type would include a much larger number of the elements described above, for example, the mirror array 222 could be of the size 1024 (wide)×800 (high) mirrors; or some other size.

Figure 3:
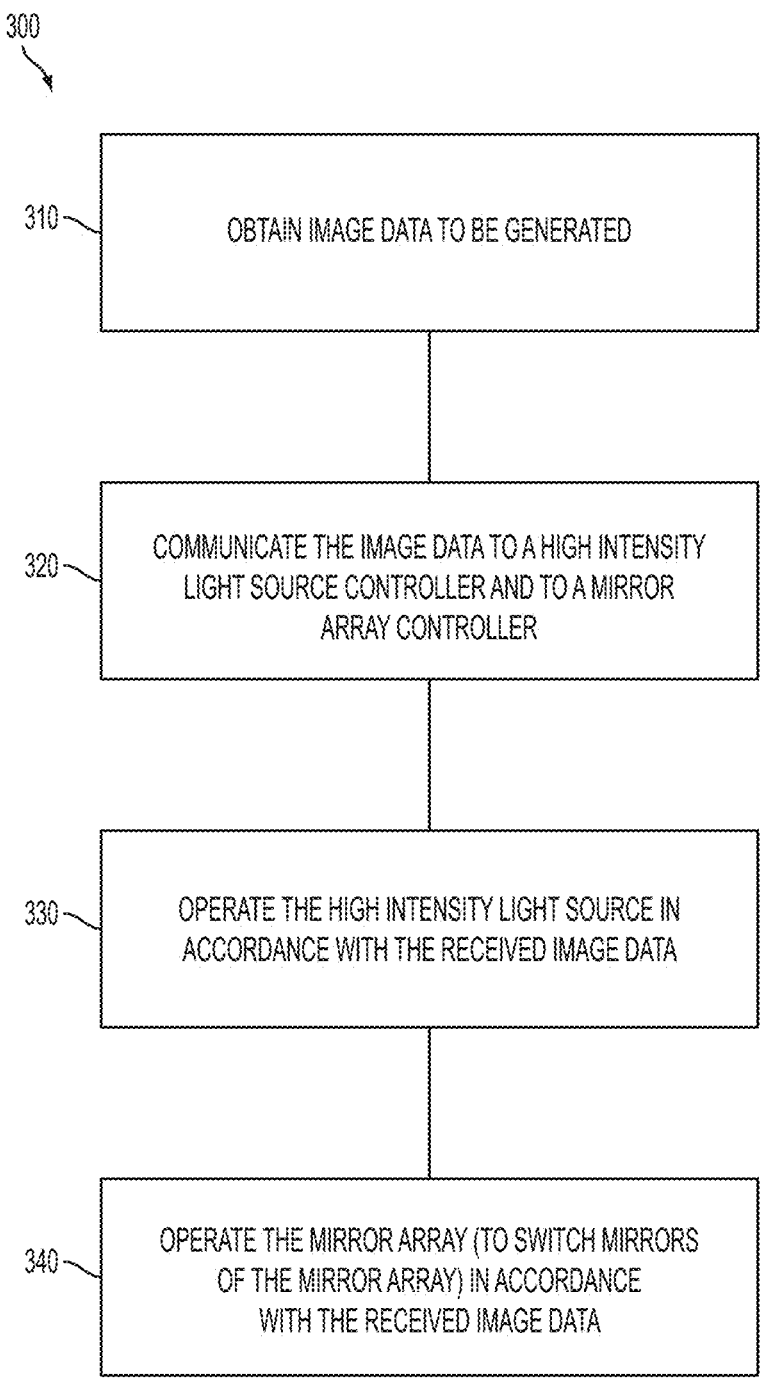
FIG. 3 is a flow diagram illustrating a flow of operations for the system of FIG. 2A.

In overview, flow diagram 300 of FIG. 3, illustrates one example for the operation of the high intensity power light source 210 and the mirror array 222 of the imaging system 200 of FIG. 2A (as well as other relevant imaging systems). Particularly, the imaging system obtains data for the images to be generated 310. This image data is communicated to a high intensity light source controller and to a mirror array controller (these controllers being separately configured and/or configured as a single system) 320. The high intensity power light source (e.g., laser configuration) is then operated in accordance with the received image data 330. Finally, the mirror array is operated (the individual mirrors are switched or rotated) in accordance with the received mirror image 340.

Turning now more particularly to the concepts of the present application, if, as shown in relation to FIG. 2A, light is spread over multiple mirrors of a mirror array and light from individual columns of those mirrors is then focused into a single pixel along a line on an imaging substrate, it is possible, while the imaging system is operating (i.e., generating output images), to maintain the associated pixel in an OFF imaging state while still alternately switching some portion of the mirrors associated with the OFF pixel. This allows the associated mirrors to be exercised (i.e., switched back and forth between mirror ON and OFF states) to counteract the deleterious effects of plastic deformation of the mirror hinges and extend their lifetime (while the imaging process is taking place). Such a situation is achieved by ensuring the number of mirrors being exercised does not generate a summed illumination at the OFF-state pixel which is above the threshold value. Thus during the pixel dwell time (which is when the pixel is either in an OFF state or an ON state, not when it is transitioning), mirrors are switching between an ON state to an OFF state at least once.

It is considered useful here to clarify the difference between the process or image pixel dwell time and the mirror dwell time. For example, a video image might have a frame time (pixel time) of 30 ms, corresponding to a dwell time somewhat shorter than is perceivable by a human observer. Or similarly there are processes where thermal time constants are much longer than mirror switching times. In these cases mirror ON and OFF times can be far shorter than the frame dwell time (or image pixel dwell time) and still provide the same integrated light fluence. It is the distinction between the image pixel dwell time (relatively long) and the mirror state dwell time (relatively short) that allows hidden modulation to be achievable.

To investigate the threshold concept of the present application, the inventors experimentally constructed anamorphic systems with a laser illuminating approximately 20 rows of mirrors. These experiments have shown that if 10 of these 20 mirror array channels are turned OFF, no print image is obtained, i.e. if 50% of the power is removed. Results of the variable data lithographic printing experiment are shown in FIGS. 4A and 4B and are indicative of a threshold process, where the image 400 of FIG. 4A shows the amount of pigment coverage at 100% power (full pigment coverage), 75% power (some pigment coverage), and 50% power (minimal to no pigment coverage). Graph 410 of FIG. 4B depicts a threshold curve 420 corresponding to the image output of FIG. 4A, which identifies a print threshold 430 (75%) as well as a desired or critical threshold 440 (50%).

As the simplified drawing of FIG. 2A includes only three mirrors in a column, FIG. 5 is provided to further illustrate the present concepts. FIG. 5 depicts a single column 510 of 20 mirrors 512-1 through 512-20 of a larger mirror array. As described above in order to maintain the associated pixel in an OFF imaging state, the experimental ON/OFF states of the mirrors 512-1 through 512-20 can consist of 50% of the mirrors being ON at any given time. As shown in FIG. 5, this can be achieved by having 50% of mirrors flipping between ON/OFF states 180 degrees out of phase with the other 50% (e.g., even numbered mirrors 512-2 through 512-20 of FIG. 5A first being ON and odd numbered mirrors 512-1 through 512-19 being OFF, and then in a following switching operation 514 the even numbered mirrors 512-2 through 512-20 are switched OFF and the odd numbered mirrors 512-1 through 512-19 are turned ON). It is to be appreciated the switching sequence of FIG. 5 is used only as an example and other switching sequences will be used for the appropriate circumstance.

Thus in imaging systems that operate using a threshold, when combined with the ability to turn on a subset of a full set of mirrors to create a pixel with an intensity below that threshold, and then to go to another equivalent subset of those mirrors and create, in effect, the same sub-threshold intensity, the summed illumination will not be changed, but it will be possible to switch mirrors during at least a portion of a predetermined time and thereby obtain an annealing effect as described above.

While the above discussion has stated the threshold as being a specific value (e.g., 50%), it is to be understood that in actual implementations other variables and imprecision may make it appropriate to define the threshold to include a margin from a fixed calculated or experimental threshold value. For example, if the calculated or experimental threshold value is 50%, then a margin of approximately 20% from that calculated value maybe used—i.e., the margin threshold being anywhere from 30% to 50% (alternatively in certain embodiments the margin may be anywhere in the range from 20% to 50% from a calculated or experimental threshold value). Therefore, the threshold may include more slope than shown in the FIG. 4B, for example.

A concept of this embodiment therefore includes the notion of a threshold, and that if actions are taken such that the total power at the imaging portion of the system (i.e., an associated pixel) is below the threshold, then a number of operations can be undertaken that provides sufficient output illumination, such as by switching ON an upper half and turning OFF a lower half of a subset of the mirrors, whereby the output illumination will stay below the threshold, while exercising the mirrors to remove stress bias and avoid or reduce hinge creep at the same time imaging operations are occurring.

While the present discussion related to exercising mirrors of the mirror array has initially focused on switching mirrors associated with a pixel that is in an OFF imaging state (during the imaging process), there are situations where the exercising may take place for mirrors associated with pixels that are in an ON imaging state (i.e., the illumination needs to be above the threshold). This operation would be accomplished in an equivalent manner as described above, as long as there is sufficient illumination being provided to the end point of the image processing (i.e., the pixel in an ON imaging state). Particularly, as long as the mirrors being switched during the process do not cause the summed illumination corresponding to the ON imaging state of the pixel to fall below the appropriate or critical ON threshold.

It is also to be understood that in some systems each mirror is receiving that same amount of illumination. Frequently, however, a line of illumination may be created (of the array), where the line has a very finite width (e.g., 20 to 100 or more mirrors in height). However, there is not a perfectly flat light distribution. In fact, it may be closer to a Gaussian distribution, or a Bell curve distribution. In that case, different mirrors would generate different outputs (e.g., some may be hotter than others). For example, mirrors out at the end of the column would get a much smaller contribution of light. In such systems an ON/OFF algorithm for such a distinct arrangement may be used to exercise the associated mirrors, whereas mirrors in the middle could require a different ON/OFF sequencing from mirrors out at the end of the column. So one algorithm might be that every other mirror is turned ON or OFF in a column. In this way there is a shifting in the Gaussian contribution, where both contributions from the tail and the middle of the illumination would be obtained.

It is also to be appreciated that there will never be perfect illumination, and it would be beneficial to work at higher than the exact power needed to have light reflected off the mirrors. In this way some of the power might be thrown away, but then it is possible to switch ON and OFF some mirrors to level the distribution, even if the incoming distribution isn't uniform, in this way mirror switching can be used to correct the irregular illumination to obtain a beneficial output.

The foregoing discussion has been directed to imaging systems that map the mirrors of the mirror array onto a one-dimensional line of pixels. One could in the same way do this and use multiple lines by using wider illumination which would apply equally well. In this situation there would be a set of digital mirror arrays, one next to each other in the column direction. So, for example, 20 mirrors could be used for one line, and then 40 mirrors could be used to obtain two parallel lines.

It is noted that in certain situations a full solid area requires that a column of mirrors must all remain on for some time period during the image processing, and they are not able to be exercised during the formation of that image. In these situations, the present concepts also provide for exercising of these mirrors in a time between imaging time periods (e.g., inter-page print gaps) using a duty switching cycle such that the total time averaged duty cycle approaches 50/50%. This balancing duty cycle then creates a time averaged 50/50 duty cycle. In some cases, this duty cycle balance might alternatively need to be implemented at the end of a manufacturing shift as a turn off procedure prior to powering off of the imaging system, both these situations can be combined with the concepts described herein where the switching takes place while imaging is still occurring.

It is, however, appreciated that most printing and imaging applications on average have imaging requirements with ON states which are typically far less than 50% so creating a balanced duty cycle during image processing is possible. For example, offset print applications typically have ink coverage less than 25% for any given color, and laser case coding applications typically have far less than 10% of the marking area being used at any given time.

Thus with these low print ON duty cycles, it is possible to use the present concepts to time average balance individual mirror operations towards a 50/50 duty cycle for an imaging process that employs a threshold.

Figure 6:
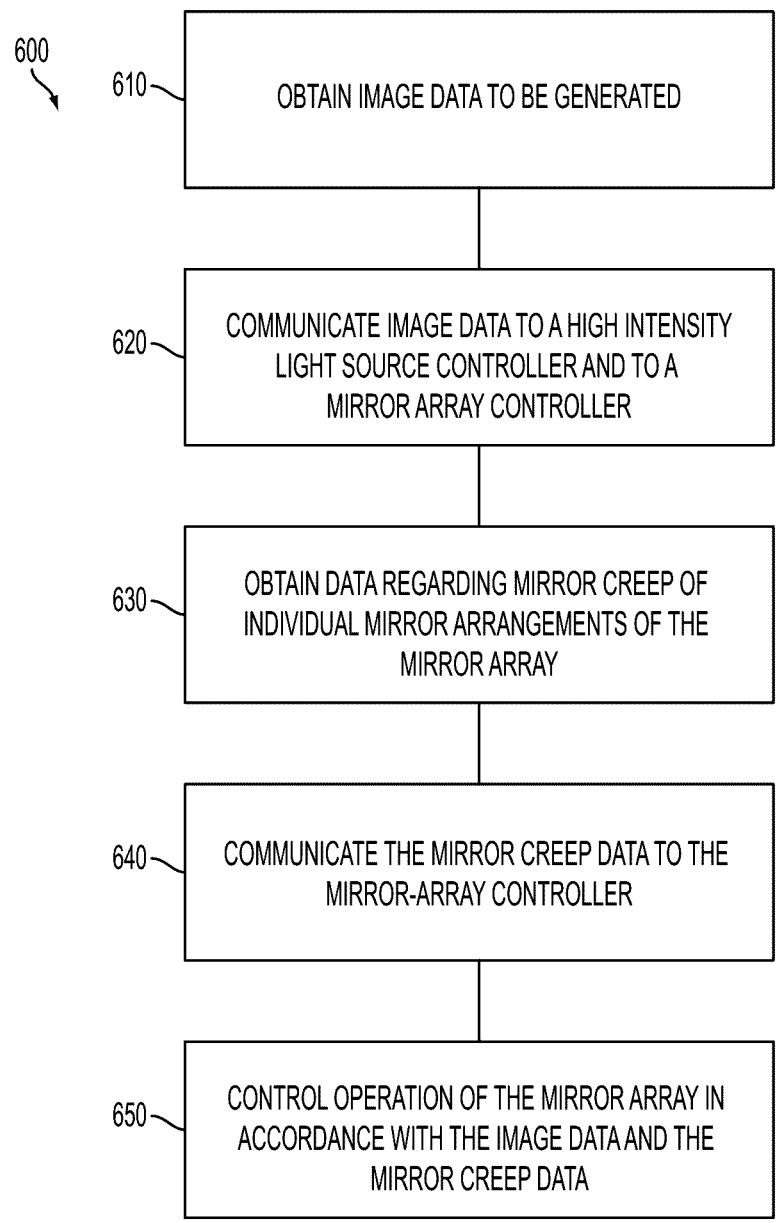
FIG. 6 is a flow diagram by which an imaging system operates in accordance with the concepts of the present application.

Turning to FIG. 6, illustrated is a flow diagram 600 by which an imaging system such as imaging system 200 may be operated to accomplish the concepts of an embodiment of the present application. Initially, the imaging system obtains image data for the images to be generated 610. This image data is communicated to a high intensity light source controller (e.g., laser arrangement controller) and to a mirror array controller (these controllers being separately configured and/or configured as a single system) 620. Then data may optionally be obtained regarding hinge creep of individual mirror arrangements of the mirror array 630. The obtained hinge creep data is then communicated to the mirror array controller 640. Thereafter operation of the mirror array is controlled in accordance with the image data and the hinge creep data 650.

Figure 7:
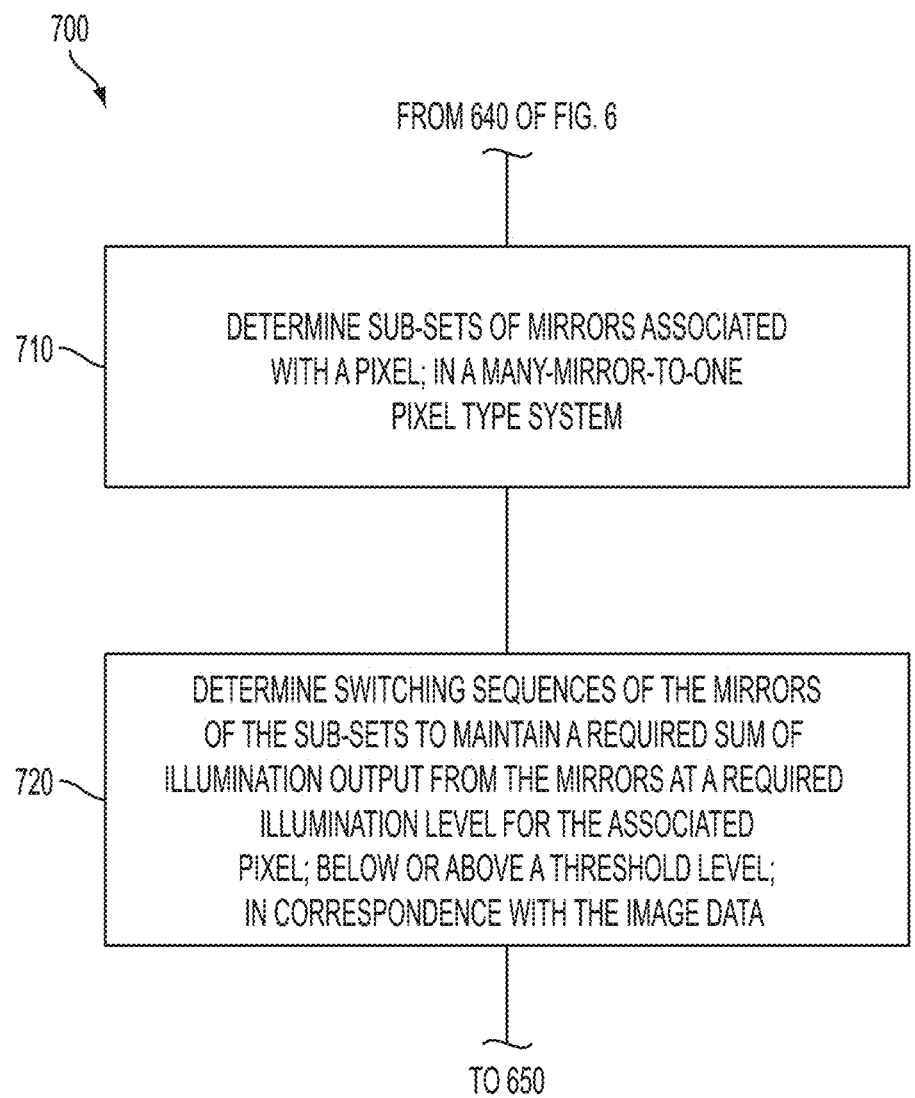
FIG. 7 provides additional detailed flow operations in connection with the flow diagram of FIG. 6.

Turning to FIG. 7, illustrated is a flow diagram 700 which provides additional operational detail for the flow diagram of FIG. 6. In this additional processing description the system determines the sub-set of mirrors of all the mirrors in the mirror array that are associated with particular individual pixels 710. The system then determines the switching sequences of the mirrors in the sub-set to maintain a required sum of illumination output from the sub-set of mirrors for the required illumination at the associated pixel of the sub-set 720.

One Mirror to One Pixel Imaging Systems

Turning now to another embodiment of the present application, while the foregoing discussion was directed to many (mirrors) to one (pixel) type imaging systems (e.g., one example being shown in FIG. 2A), the concepts of the present application can also be used in other imaging systems, such as that of FIG. 8A which illustrates a simplified single mirror to single pixel-type imaging system 800. In FIG. 8A, a high intensity power light source 810, projects light onto mirrors (mirror arrangements) 820-1 to 820-8 of a mirror array 820, from which light is selectively reflected to pixel areas 830-1 to 830-8 of a receiving surface or substrate 830. A controller 840 is in operative connection with the high intensity power light source 810 and the mirror array 820, to send and receive data, and is further configured to receive external image data (ID).

Figure 9:
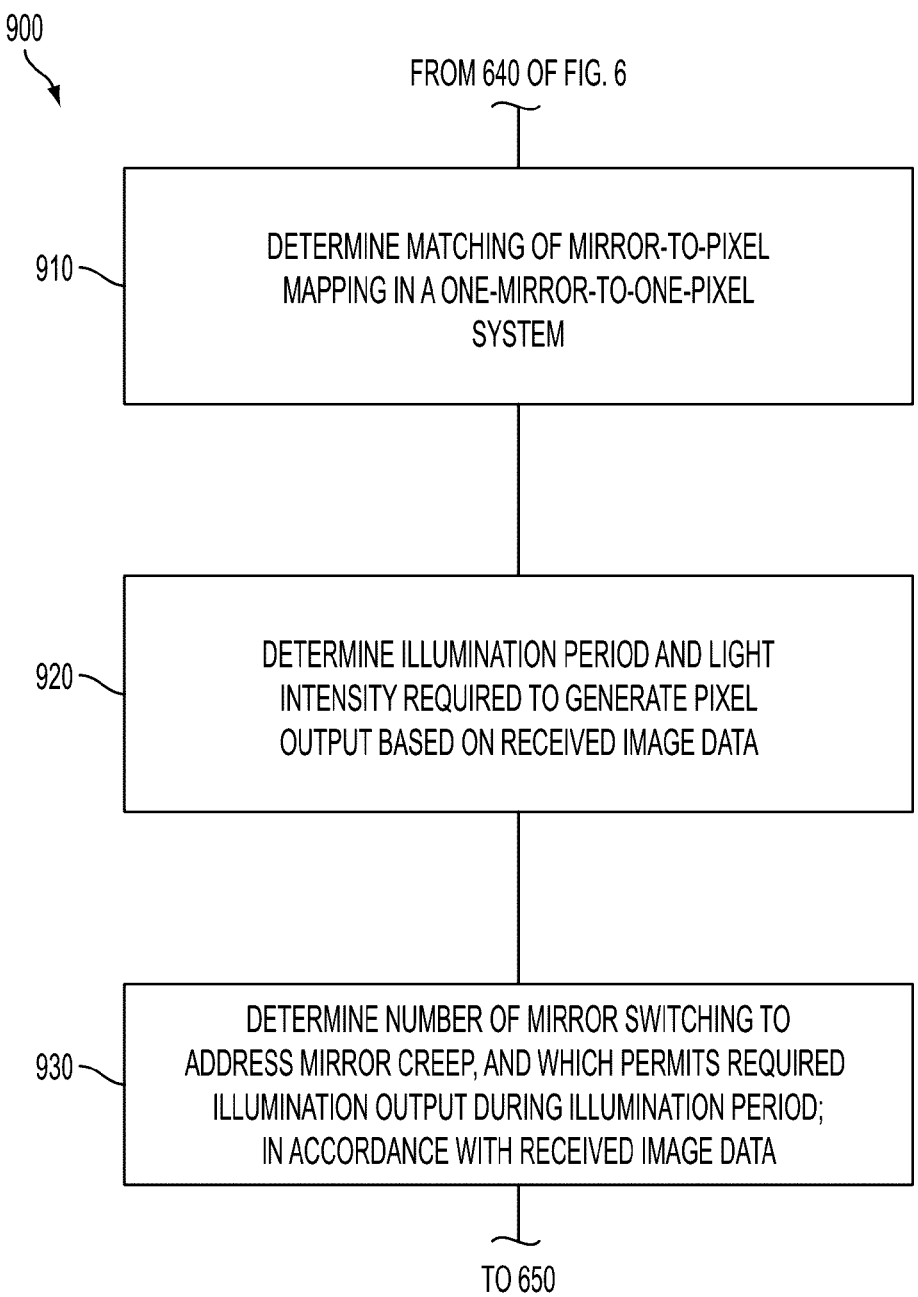
FIG. 9 is a flow diagram which provides additional steps to the flow diagram of FIG. 6 for implementation in a one mirror to one pixel type imaging system.

Turning to FIG. 9 illustrated is a flow diagram 900 (which provides a description of additional operational detail to the flow diagram of FIG. 6) for implementation of the present concepts in a one (mirror) to one (pixel) type imaging system such as shown in FIG. 8A.

Moving from step 640 of FIG. 6, FIG. 9 includes a step of determining a matching or mapping of mirrors to pixels 910. Then a determination is made of an illuminating period and light intensity required to generate pixel output based on received image data 920. Next a determination is made as to the number of mirror switching that can be undertaken by a particular mirror to address hinge creep, and which also permits required illumination output during the illumination period for the mapped (associated) pixel, in accordance with the received image data 930.

A use of a one-to-one imaging system is to project a two-dimensional image at any instant in time which might, for example, correspond to one frame of an electronic image. This type of imaging can be accomplished by shining white light on an array of mirrors and creating the two-dimensional images by switching the mirrors of the array ON and OFF in a predetermined manner. The light may be projected as solely a grey scale image and/or pass through color filters to create a full color image.

The human eye basically sees at a rate of approximately 30 frames per second, which means each frame is viewed for approximately 30 milliseconds, and maybe each color is on a screen for 10 milliseconds. In 10 milliseconds the mirrors of a typical mirror array can be switched 1,000 times or more.

Therefore grey scale is obtained by switching the mirror associated with a pixel that is to have the grey scale a certain percentage of the time. For example, assuming that a 40% light level at a pixel is desired. So the associated mirror would be ON for 40% of the time, and OFF 60% of the time, to obtain a grey scale level of 40% on the screen for that particular pixel. In the same way, if a very bright illumination, like a laser, is being used (e.g., for a theatre or for very small devices such as Google glass) the very high power density will start to cause plastic deformation (hinge creep).

The human eye integrates image patterns over times of approximately 30 milliseconds, therefore, the mirror associated with a particular pixel can be switched back and forth at a very high rate (e.g., 1,000 times or more within every 10 milliseconds), ON and OFF, to exercise the mirror thereby obtaining an annealing effect (i.e., unwinding of the plastic deformation of the hinges). While at the same time, a person viewing the image patterns will not be aware this switching is taking place.

One example to obtain this annealing or unwinding effect is by using an algorithm that keeps the summed light reflected out of the particular mirror being exercised at the required level (e.g., the mentioned 40%, where the switching is being done such that there is approximately equal switching in each direction (ON/OFF) during, for example, 10 milliseconds. It is understood in this discussion, while 40% is used as the light level output, light levels other than 40% can take advantage of these concepts. Further, while it is explained that mirrors can be switched at rates of 1,000 times every 10 milliseconds, much higher switching rates (e.g., 100,000 or higher per 10 milliseconds) are potentially achievable.

Diagnostic Operation

With attention to image generating systems of FIGS. 2A-2B and 8A-8B, an additional aspect of the present application is the incorporation of a diagnostic aspect to assist in optionally determining a status of the individual mirrors of the mirror arrays.

The diagnostic operation includes turning power off to the mirror array of the imaging systems, then taking measurements of a rest angle for the mirrors to obtain residual deformation data of the mirrors of the mirror array (i.e., how far from 0° each mirror is located). Periodic observation of the degree of misalignment is used to trigger remediative exercising of the hinges. In a particular embodiment each mirror of the array is measured.

It is to be appreciated the power off to the mirror array of imaging systems is distinct from an OFF state of the mirrors, while the imaging systems are operating to generate output. Particularly, the OFF state of the mirrors moves the mirrors (e.g., by an electrostatic pull) to, for example, −12°, while powering off the mirror array attempts to have the mirrors move to 0°.

In the diagnostic operation, the residual deformation data, is provided to the imaging system (e.g., the controller) and is used (incorporated) into the de-stress switching control operations to perform more selective control operations in order to fix the deformations (e.g., mirror "AA" is off-set from 0° in the power down situation by −5°, so additional de-stress operations need to be instituted for this mirror (and the operations can be selected to provide more stress in the +12° direction), and mirror "BB" is at 0° in the power down situation, so it does not need extra de-stress operations). It is understood the measuring may be obtained by known measuring devices such as a CMOS imager mapping intensities of reflected light, and the use or incorporation into the de-stress operations is intended to mean such data is used when generating an algorithm to determine to which mirrors, for how long, and with what ON/OFF bias the de-stress operations are applied.

For example, returning attention to FIGS. 2A-2B and 8A-8B, expanded sections 240 and 840 show exemplary mirror arrangements 225-43 and 820-8 in more detailed views, with mirror arrangement 225-43 having hinges 225-43-A, 225-43-B and mirror (or mirror arrangement) 820-8 having hinges 820-8-A and 820-8-B. Additionally, each of the mirrors also have measuring devices 225-43-C and 820-8-C which are configured to measure the state of the respective mirror angles, including when the mirrors are in an ON state, and OFF state, and a rest state (i.e., when power is removed from the mirror array. This angle related data is provided to the controllers (e.g., 226, 840), for various uses including the above-discussed diagnostic operations. Additionally, the time history of a particular mirror's ON state can be recorded and continuously updated so as to be used to balance the amount of time a mirror sees in the OFF state approach a running time average of a 50/50 duty cycle.

It is understood the controllers of the present application include the electronics and memory capacities and configurations to store and process computer software instructions sufficient to carry out the operations which have been described herein.

Still further it is understood that the mirror arrays shown in the drawings of the present application are simplified versions of mirror arrays, which in commercial implementations are commonly arrays that are 1024 mirrors wide, and 768 mirrors high, as well as other sizes. The present concepts are applicable to such arrays as well as others.

Turn ON Threshold

In addition to ideally having a turn ON threshold greater than 50% of full power, the turn ON threshold is ideally somewhat less than 100% power. The reason for this turn-ON power margin is to make a system that is stable against aging. For example, there may be single mirror failures which may be unrelated to hinge-creep but due to semiconductor manufacturing defects in the chip. Or for example, a 48 emitter diode bar may have a single emitter facet defect causing 1 of the 48 emitters to fail, reducing the total output power by about 2%. In addition, optical interference noise or laser speckle needs to be above the print threshold. A properly designed system takes all of these non-idealized effects into account. Ideally MEMS mirror failures obey a bath-tub like failure rate probability over time, whose long term failure rate can be predicted by a known fitting function such as a Weibull distribution which is a fitting function for failure rates as a function of temperature. In order to extend micro-mirror array reliability for high power laser applications, it is advantageous to have enough power margin, such that some of the mirrors can fail, for random or unexplained reasons. For example, a situation is assumed where the laser power is spread equally over 50 mirror pixels to generate 1 print pixel. Providing a 10% power margin in this situation allows for 5 mirrors to randomly fail and still maintain print operation above a turn ON threshold.

Life Testing

In performing experiments related to the present concepts, the temperature of the mirrors was determined using thermoreflectance. A probe laser (532 nm wavelength) was reflected off a micro-mirror array and a low NA light microscope objective imaged the array onto a camera focal plane. Heaters were used to set the array temperature at various levels while the reflectance was measured by camera. The results provide a calibration curve of reflectance versus mirror temperature.

Figure 10A:
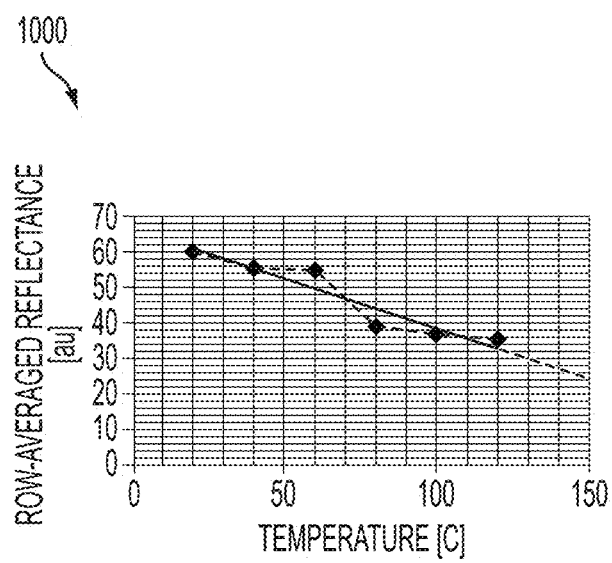
FIGS. 10A and 10B illustrate the results of a heating experiment in connection with the present application.
Figure 10B:
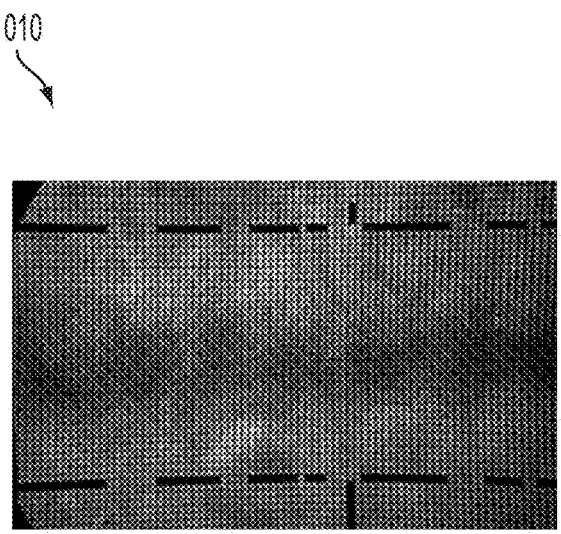

Graphs 1000 and 1010 of FIGS. 10A and 10B illustrate the results of the above heating experiment, which yielded a predictive curve for the averaged reflectance vs. temperature due to the decrease in aluminum reflectivity (increase in optical absorption) with increased temperature as well as any slight changes in the mirror curvature causing a decrease in the collected light intensity by the camera.

Figure 11:
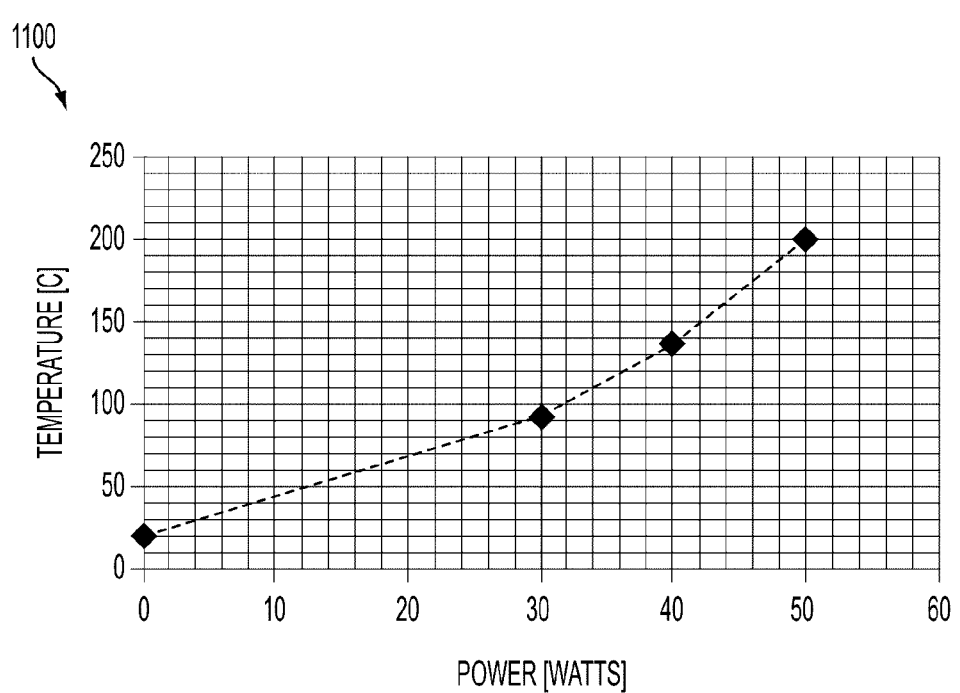
FIG. 11 illustrates a graph of local reflectance reduction versus laser power in accordance with the concepts of FIGS. 10 and 10B.

When the calibration heat source is removed and a high power laser line is used (with wavelength different from the probe wavelength, e.g. 980 nm, so that laser illumination can be filtered from the thermoreflectance signal), the mirrors are heated depending on the local illumination intensity. The temperature profile over the laser line can be seen in FIGS. 10A and 10B. The peak temperature at the center of the laser line can then be determined from the local reflectance reduction vs. the laser power or laser current as shown in graph 1100 of FIG. 11.

From the literature it is well known that as aluminum increases in temperature its reflectance decreases and absorption increases. This leads to more energy absorbed (thermal runaway) and can lead to permanent restructuring of the aluminum micro-mirrors, further reducing their reflectivity. Thus a fairly sharp onset of degradation is anticipated above a certain temperature and stable operation below a certain temperature that is largely free from hinge creep at a duty cycle close to 50/50.

Experimental Results

Figure 12:
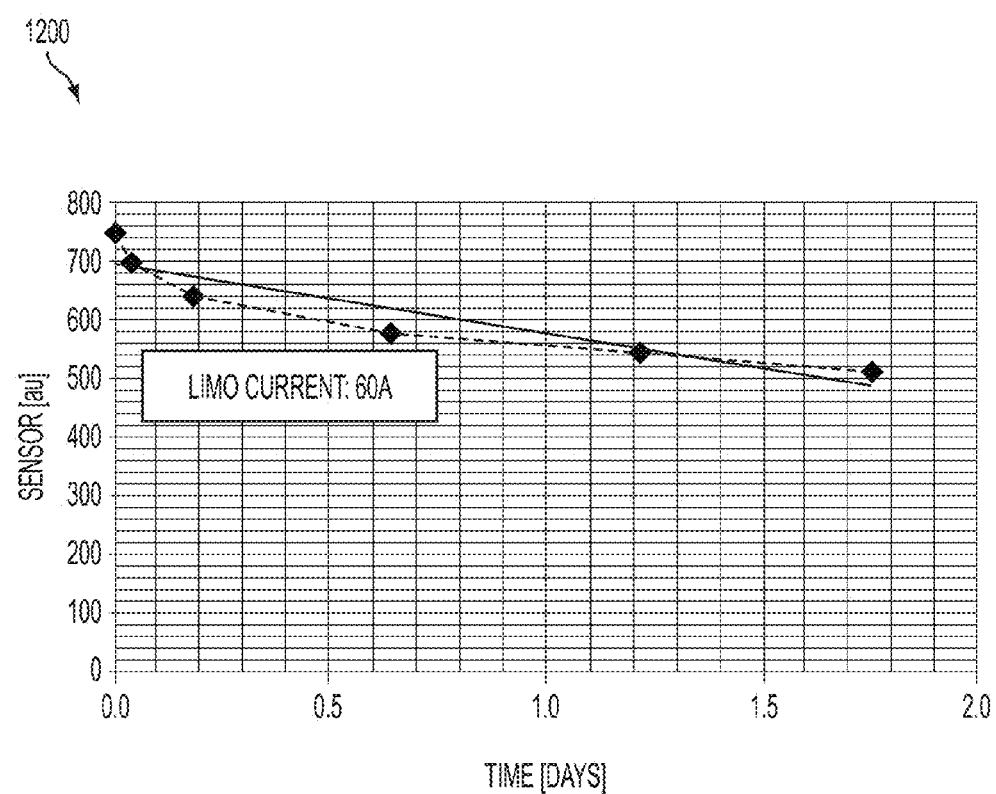
FIG. 12 illustrates a heating profile.

Graph 1200 of FIG. 12, illustrates a thermal runaway process when operating the mirrors above 200 C, which occurs at about 50 W of power (60 A of current) spread over approximately 20×1000 mirrors on a pitch of 10.8 microns. In as little as 24 hours, there is a noticeable drop off in mirror output efficiency within the variable data lithographic optical system even though mirrors are still switchable between ON and OFF states.

Figure 13:
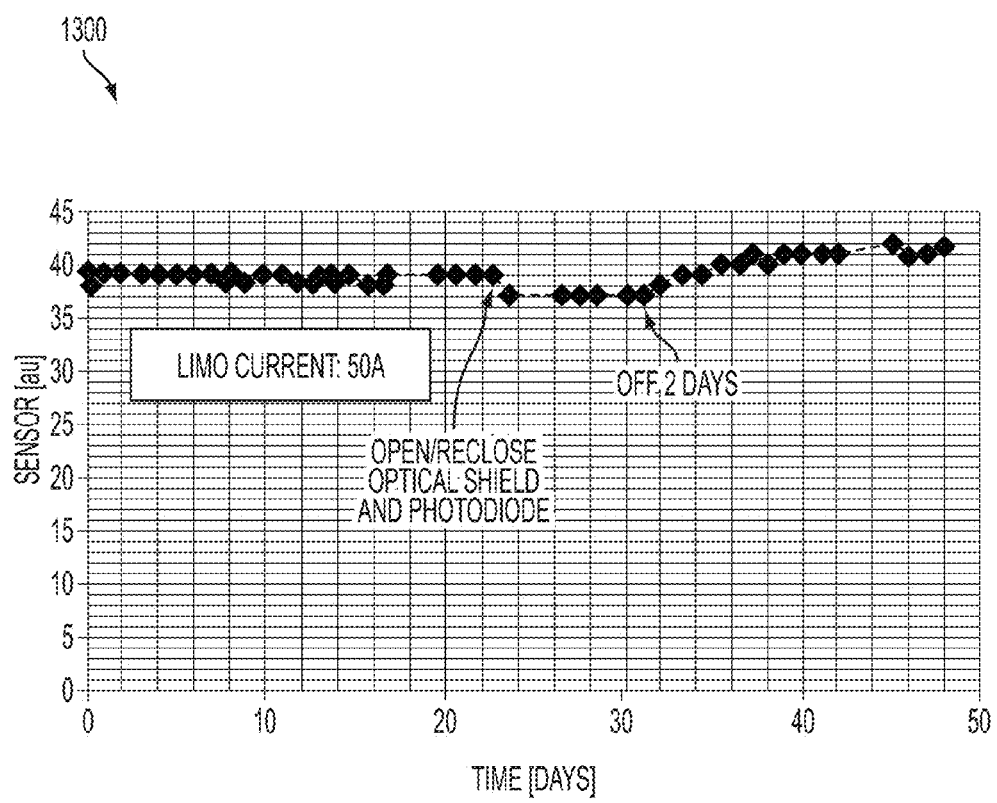
FIG. 13 depicts another heating profile in comparison to that of FIG. 12.

However, as shown in FIG. 13 when operated at 40 W of power (50 A of current) spread over the same area, there is no noticeable drop off in mirror output efficiency after almost 50 days and 1,200 hours of operation even though the predicted temperature is 130 C. Key to this reliability is frequent exercising of the mirrors at or near the 50/50 duty cycle level to suppress hinge creep.

Damage Reversal

Figure 14:
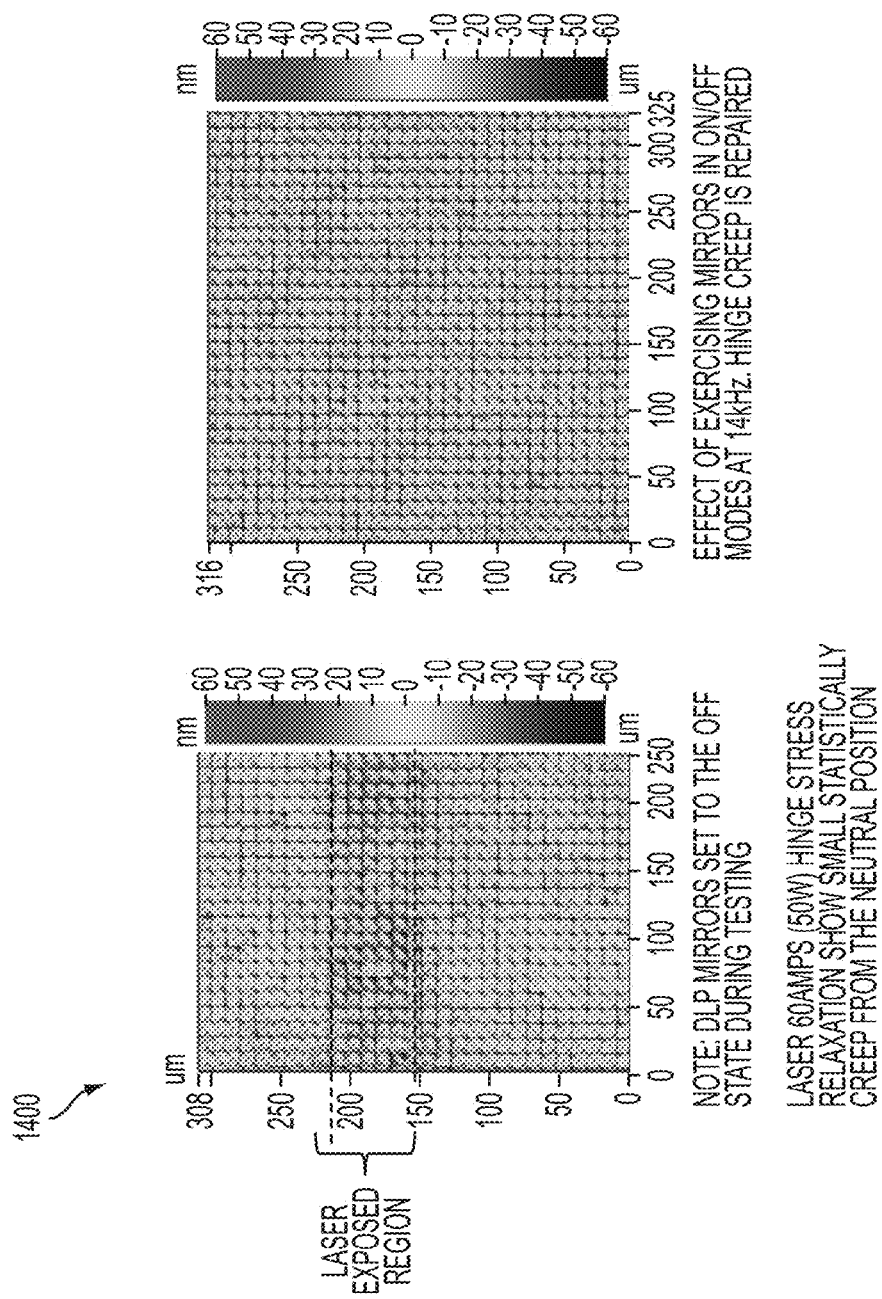
FIG. 14 is an image verifying the hinge creep repair.

FIG. 14 experimentally verifies hinge creep repair with high power 60 W laser operation concentrated over just 20 rows of mirrors from for example a Texas Instruments 5500 series chip, which consists of two Wyko interference measurements of the mirrors.

As can be seen in the left image of FIG. 14, mirror hinge creep has been induced after high power laser exposure for mirrors which were left in the OFF state. By following this exposure with an ON/OFF flipping action at 14 kHz over ~10 minutes, the mirrors appear to have largely repaired themselves as shown in the right-side image of FIG. 14.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A method of extending operational life of a mirror array of an image generating system, wherein the image generating system further includes a light source to selectively cause light to impinge on the mirror array, resulting in deleterious plastic deformation of associated hinges of the mirror array, and an image output generating section configured to receive light from the mirror array, the method comprising:

receiving by the image generating system image data used to control mirrors of the mirror array and generate an output image, wherein the image generating system projects multiple mirrors to a single output image pixel;

providing a required level of illumination from the mirror array to the image output generating section over a predetermined time period, in accordance with the received image data;

during that same predetermined time period of providing the required level of illumination from the mirror array to the image output generating section, performing de-stress switching operations for selected ones of the mirrors of the mirror array to reduce the plastic deformation of the associated hinges, wherein during the de-stress operations selected mirrors of the mirror array are switched out of phase with each other, maintaining an OFF image pixel state, and minimizing hinge memory effects by balancing torsional stresses from hinge creep; and generating an output image based on the received image data, wherein the de-stress switching operations occurring during the providing of the desired level of illumination is undetected, wherein the method is performed by use of at least an electronic processor.

2. The method according to claim 1 wherein a pixel is in an ON state when the desired level of illumination in that pixel is above a predetermined threshold.

3. The method according to claim 2 wherein the predetermined threshold is one of (i) a fixed threshold value, and (ii) in a range of 5% to 20% from a fixed threshold value.

4. The method according to claim 1 wherein a pixel is in an OFF state when the desired level of illumination in that pixel is below a predetermined threshold.

5. The method according to claim 4 wherein the predetermined threshold is one of (i) a fixed threshold value, and (ii) in a range of 5% to 20% from a fixed threshold value.

6. The method of claim 1 wherein other de-stress switching operations occur in a time period between which images are being formed.

7. The method of claim 1 wherein other de-stress switching operations occur in a time period following the formation of images and prior to shutdown of the image generating system.

8. The method according to claim 1 wherein the undetected de-stress switching includes a switching time equal to or less than 30 milliseconds.

9. The method according to claim 1 wherein the light source generates a light beam having an intensity between 5 W/mm$^2$ to 50 W/mm$^2$.

10. The method according to claim 1 wherein the mirror array is a micro-mirror array.

11. A method of extending operational life of a mirror array of an image generating system, wherein the image generating system further includes a light source to selectively cause light to impinge on the mirror array, resulting in deleterious plastic deformation of associated hinges of the mirror array, and an image output generating section configured to receive light from the mirror array, the method comprising:

receiving by the image generating system image data used to control mirrors of the mirror array and generate an output image;

providing a required level of illumination from the mirror array to the image output generating section over a predetermined time period, in accordance with the received image data;

during that same predetermined time period of providing the required level of illumination from the mirror array to the image output generating section, performing de-stress switching operations for selected ones of the mirrors of the mirror array to reduce the plastic deformation of the associated hinges, generating an output image based on the received image data, wherein the de-stress switching operations occurring during the providing of the desired level of illumination is undetected, and entering the mirror array of the image generating system to a power-off state; measuring a rest angle of each mirror of the mirror array to obtain residual deformation data of each mirror of the mirror array; providing the residual deformation data to the imaging system; and using the provided residual deformation data in the de-stress switching operations, and wherein the method is performed by use of at least an electronic processor.

12. The method according to claim 11 wherein the image generating system projects multiple mirrors to a single output image pixel.

13. The method according to claim 12 wherein the image generating system projects an anamorphically focused image, using optical focusing elements.

14. The method according to claim 12 wherein for an image pixel in an OFF state, switching ON approximately 30% to 70% of the mirrors associated with the image pixel in the OFF state, and switching the remaining mirrors to an OFF state.

15. A method wherein an image generating system includes a light source to selectively cause light to impinge on a mirror array, resulting in deleterious plastic deformation of associated hinges of the mirror array, and an image output generating section configured to receive light from the mirror array, the method comprising:

receiving by the image generating system image data used to control mirrors of the mirror array and generate an output image;

providing a required level of illumination from the mirror array to the image output generating section over a predetermined time period, in accordance with received image data;

during that same predetermined time period of providing the required level of illumination from the mirror array to the image output generating section, performing de-stress switching operations for selected ones of the mirrors of the mirror array to reduce the plastic deformation of the associated hinges, and generating an output image based on the received image data, wherein the de-stress switching operations occurring during the providing of the desired level of illumination is undetected, wherein the providing of the de-stress switching operations undetected, includes at least one of (i) generating a printed output corresponding to the supplied image data that has substantially the same measurable output values as a printed output generated using the same supplied image data using the same image generating system without any de-stress switching operations being performed, and (ii) generating a projected output image having substantially the same measurable output values as a projected output image generated using the same supplied image data using the same image generating system without any de-stress switching operations being performed, and wherein the method is performed by use of at least an electronic processor.

16. An image generating system including:

a mirror array including a plurality of mirrors having torsional hinges subject to plastic deformation at high temperatures wherein the image generating system projects multiple mirrors of the mirror array to a single output image pixel;

a light source configured to cause light to impinge onto the mirror array;

an electronic controller including a memory section configured to operate software to control operation of the light source and the mirror array, including being configured to:

receive image data to control mirrors of the mirror array and to generate an output image, wherein the image generating system projects multiple mirrors to a single output image pixel;

provide a level of illumination from the mirror array to an image generation section over a predetermined time period, in accordance with the received image data;

during the same predetermined time period of providing the required level of illumination from the mirror array to the image generation section, perform de-stress switching operations for selected ones of the mirrors of the mirror array to reduce plastic deformation of the associated hinges, wherein during the de-stress operations selected mirrors of the mirror array are switched out of phase with each other, maintaining an image pixel state, and minimizing hinge memory effects by balancing torsional stresses from hinge creep, and generate an output image based on the received image data, wherein the de-stress switching operations occurring during the providing of the desired level of illumination is undetected.

* * * * *